US012628352B2

(12) United States Patent (10) Patent No.: US 12,628,352 B2
Rao et al. (45) Date of Patent: May 12, 2026

(54) THRESHOLD SWITCHING MATERIAL, THRESHOLD SWITCHING DEVICE AND PREPARATION METHOD THEREOF

(71) Applicant: SHENZHEN UNIVERSITY, Shenzhen (CN)

(72) Inventors: Feng Rao, Shenzhen (CN); Keyuan Ding, Shenzhen (CN); Jintao Chen, Shenzhen (CN)

(73) Assignee: SHENZHEN UNIVERSITY, Shenzhen (CN)

( * ) Notice: Subject to any disclaimer, the term of this patent is extended or adjusted under 35 U.S.C. 154(b) by 359 days.

(21) Appl. No.: 18/241,895

(22) Filed: Sep. 4, 2023

(65) Prior Publication Data

US 2024/0179920 A1 May 30, 2024

Related U.S. Application Data

(63) Continuation of application No. PCT/CN2022/142133, filed on Dec. 26, 2022.

(30) Foreign Application Priority Data

Nov. 28, 2022 (CN) .......................... 202211501433.6

(51) Int. Cl.
    *H10B 63/00* (2023.01)

(52) U.S. Cl.
    CPC ..................................... *H10B 63/24* (2023.02)

(58) Field of Classification Search
    CPC ....... H10N 70/882; H10B 63/22; H10B 63/24
    See application file for complete search history.

(56) References Cited

U.S. PATENT DOCUMENTS 11,672,191 B2 * 6/2023 Chan ..................... H10N 70/021
                                                          257/4
2025/0113745 A1 * 4/2025 Sutou ................... H10N 70/841

FOREIGN PATENT DOCUMENTS

CN    108666416  A    10/2018
CN    113594359  A    11/2021

* cited by examiner

*Primary Examiner* — Mark V Prenty

(57) ABSTRACT

A threshold switching material, a threshold switching device and a preparation method thereof are disclosed. The chemical formula of the threshold switching material is $M_xD_{1-x}$, wherein M is one of La, Ce, Gd, Lu, Sc, Y, Zr, Mo, Hf, W, Ta, D is one of S, Se, Te, and $0.1 \leq x \leq 0.8$.

14 Claims, 2 Drawing Sheets

3

4

2

1

3

4

2

1

5

THRESHOLD SWITCHING MATERIAL, THRESHOLD SWITCHING DEVICE AND PREPARATION METHOD THEREOF

CROSS-REFERENCE TO RELATED APPLICATIONS

The present application is a Continuation Application of PCT Application No. PCT/CN2022/142133, filed on Dec. 26, 2022, which claims the priority of Chinese Patent Application No. 202211501433.6, filed on Nov. 28, 2022, the entire contents of which are hereby incorporated by reference.

TECHNICAL FIELD

The present invention relates to the technical field of semiconductor microelectronics, in particular to a threshold switching material, a threshold switching device and a preparation method thereof.

DESCRIPTION OF THE PRIOR ART

Memory is an important part of the current semiconductor market, as a cornerstone of information technology, and plays an important role in daily life and the national economy. With the rapid development of the semiconductor industry, the semiconductor technology has also been greatly improved, prompting the device structure to develop in a three-dimensional direction, such as 3D Xpoint and other advanced 3D storage technologies. Compared with traditional 2D storage technology, 3D storage technology has higher storage density, lower power consumption, better service life, faster read and write speed and lower cost. As one of the most potential non-volatile memories of the next generation, phase change memory has advantages of fast read-and-write speed, low operating power consumption, long cycle life, and good resistance to vibration and radiation. In a high-density integrated 3D intersection array, in order to obtain better overall performance, not only memory cells with excellent performance are required, but also switching cells that match the performance of the memory cells are required to eliminate the influence of the leakage current of selected cells on unselected cells. Among various switching cells that can be used as phase change memory cells, the threshold switching device (Ovonic Threshold Switch) using thin films of sulfur compounds as a dielectric is considered to be the most valuable switching device. The threshold switching device mainly includes upper and lower electrode materials, a thin film material of chalcogenide compound with volatile threshold transition characteristics, and an insulating dielectric material that protects the thin film material of chalcogenide compound from oxidation. The working principle of the threshold switching device is to use electrical signals to control the switch of the device, that is, when the applied electrical signals meet certain conditions, the threshold switching material transitions from a high-resistance state to a low-resistance state, so that the threshold switching device is in an open state. Various types of pulse signals can be applied to the phase change memory cells, so that the phase change memory material undergoes a reversible transition between high and low resistance, so as to realize the storage of logic "0" and "1". When the electrical signals applied to the threshold switching device is lower than a certain value, the threshold switching material transitions from a low-resistance state to a high-resistance state, and the threshold switching device is in an off state, in which state, the leakage current of other cells will not affect the resistance state of the memory cell, ensuring the reliability of information storage.

Traditional threshold switching materials are mainly multi-material systems containing As, Se, etc., which have the advantages of good thermal stability, low leakage current, and long cycle life, but they perform poorly in terms of switching speed and driving current. Moreover, multi-component materials are prone to component segregation during the repeated operation of the device, which affects the performance stability of the device. Further, As is toxic. Therefore, it is urgent to develop an environmentally friendly and component-simplified binary threshold switching material system. The reported threshold switching devices based on binary systems such as B—Te, C—Te, and Si—Te have fast switching speeds, but have the problems of low driving current, high leakage current, short cycle life, and poor stability.

Therefore, the prior arts still need to be improved and developed.

SUMMARY OF THE DISCLOSURE

In view of the above-mentioned deficiencies in the prior arts, the object of the present invention is to provide a threshold switching material, a threshold switching device and a preparation method thereof, aiming at solving the problems of low driving current and high leakage current, short cycle life, and poor stability of the threshold switching devices based on the existing binary system-threshold switching materials.

Technical solution of the present invention is as follows:

The first aspect of the present invention provides a threshold switching material, wherein the chemical formula of the threshold switching material is $M_xD_{1-x}$, wherein M is one of La, Ce, Gd, Lu, Sc, Y, Zr, Mo, Hf, W, Ta, D is one of S, Se, Te, and $0.1 \leq x \leq 0.8$.

The second aspect of the present invention provides a threshold switching device, which includes a first electrode, a threshold switching material layer and a second electrode overlapped layer by layer from bottom to top, the threshold switching material layer comprising the threshold switching material as mentioned above.

Optionally, the threshold switching device further includes:

a dielectric coating layer coated on a side of a whole of the first electrode, the threshold switching material layer and the second electrode that are overlapped layer by layer.

Optionally, the threshold switching device further includes:

a substrate having a through hole, the first electrode is disposed in the through hole, and the threshold switching material layer is disposed on the substrate and the first electrode; and a dielectric coating layer coated on a side of a whole of the threshold switching material layer and the second electrode that are overlapped layer by layer.

Optionally, the material of the first electrode is at least one of W, TiW, TiN, and TiSiN.

Optionally, the material of the second electrode is at least one of W, TiW, and TiN.

Optionally, the material of the dielectric coating layer is at least one of $SiO_2$ and $Si_3N_4$.

Optionally, the thickness of the threshold switching material layer is in a range of 2 to 40 nm.

Optionally, the material of the substrate is at least one of $SiO_2$ and $Si_3N_4$.

A third aspect of the present invention provides a preparation method of a threshold switching device, which includes the steps of:

providing a first electrode;

forming a threshold switching material layer on the first electrode, a material of the threshold switching material layer comprising the threshold switching material according to claim 1; and forming a second electrode on the threshold switching material layer.

The threshold switching material $M_xD_{1-x}$ provided by the present invention has a volatile threshold transition function, wherein M is one selected from La, Ce, Gd, Lu, Sc, Y, Zr, Mo, Hf, W, Ta. That is, compared with the existing binary system-threshold switching materials, M in the present invention is selected as a metal element, with a good conductivity, which is beneficial to increase the driving current and form a specific node of a conductive path, reducing the randomness of the conductive path formation and improving the switching speed of the threshold switching device based on such threshold switching material. Based on the unique d-orbital electronic structure of the selected element of M, when combined with one of S, Se, and Te, the crystallization activation energy of the resulted material is high, thereby obtaining a lower leakage current. The selected element of M has an atomic number greater than 20, a large atomic radius, and a small atomic diffusion coefficient, which is not prone to component segregation, and the stability is high, which in turn facilitates to obtain a longer fatigue life and higher device reliability.

DESCRIPTION OF EMBODIMENTS

The present invention provides a threshold switching material, a threshold switching device and a preparation method thereof. In order to make the purposes, technical solutions and effects of the present invention clearer and more apparent, the present invention will be further described in detail below. It should be understood that the specific embodiments described here are only used to explain the present invention, not to limit the present invention.

Unless otherwise defined, all technical and scientific terms used herein have the same meaning as commonly understood by those skilled in the art. The terms used herein in the description of the present invention are only for the purpose of describing specific embodiments, and are not intended to limit the present invention.

An embodiment of the present invention provides a threshold switching material. The chemical formula of the threshold switching material is $M_xD_{1-x}$, wherein M is one of La, Ce, Gd, Lu, Sc, Y, Zr, Mo, Hf, W, Ta, D is one of S, Se, Te, and $0.1 \leq x \leq 0.8$ (x represents the ratio of the number of atoms of the M element to the total number of atoms of $M_xD_{1-x}$, and the ratio of x to $1-x$ is the ratio of the number of atoms of the M element to the number of atoms of the D element).

The threshold switching material $M_xD_{1-x}$ according to the embodiment of the present invention is an alloy material composed of M and D, which has a volatile threshold transition function. M is one of La, Ce, Gd, Lu, Sc, Y, Zr, Mo, Hf, W, Ta. That is, compared with the existing binary system-threshold switching materials, M in the present invention is selected as a metal element, with a good conductivity, which is beneficial to increase the driving current and form a specific node of a conductive path, reducing the randomness of the conductive path formation and improving the switching speed of the threshold switching device based on such threshold switching material. Based on the unique d-orbital electronic structure of the selected element of M, when combined with one of S, Se, and Te, the crystallization activation energy of the resulted material is high, thereby obtaining a lower leakage current. The selected element of M has an atomic number greater than 20, a large atomic radius, and a small atomic diffusion coefficient, which is not prone to component segregation during the repeated operations of the device, and the stability is high, which in turn facilitates to obtain a longer fatigue life and higher device reliability.

Figure 1:
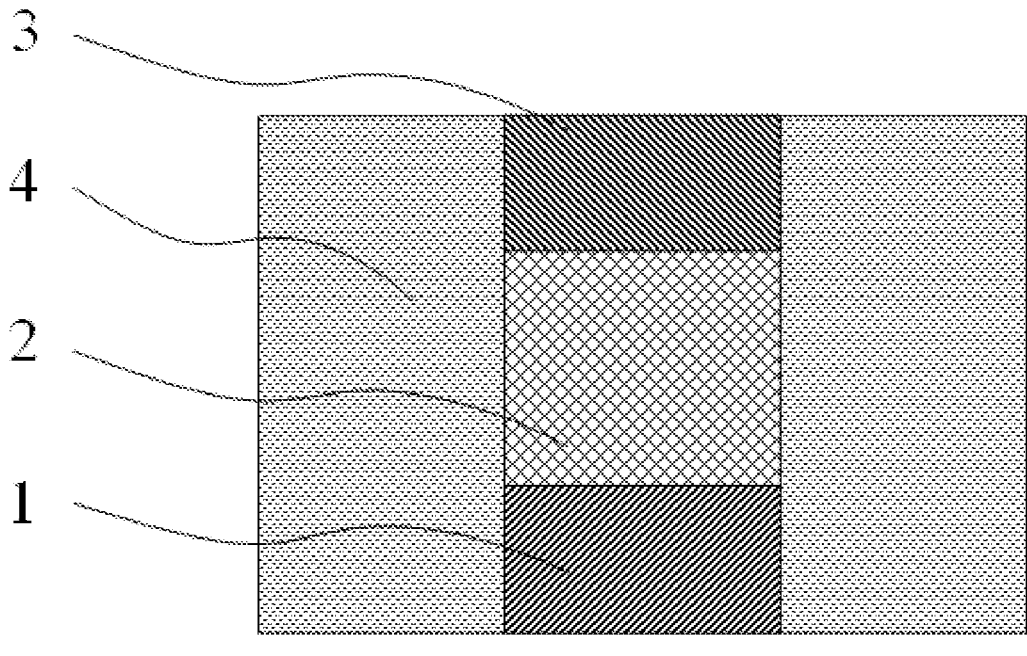
FIG. 1 is a schematic structural view of a threshold switching device having a restrictive structure according to an embodiment of the present invention.
Figure 2:
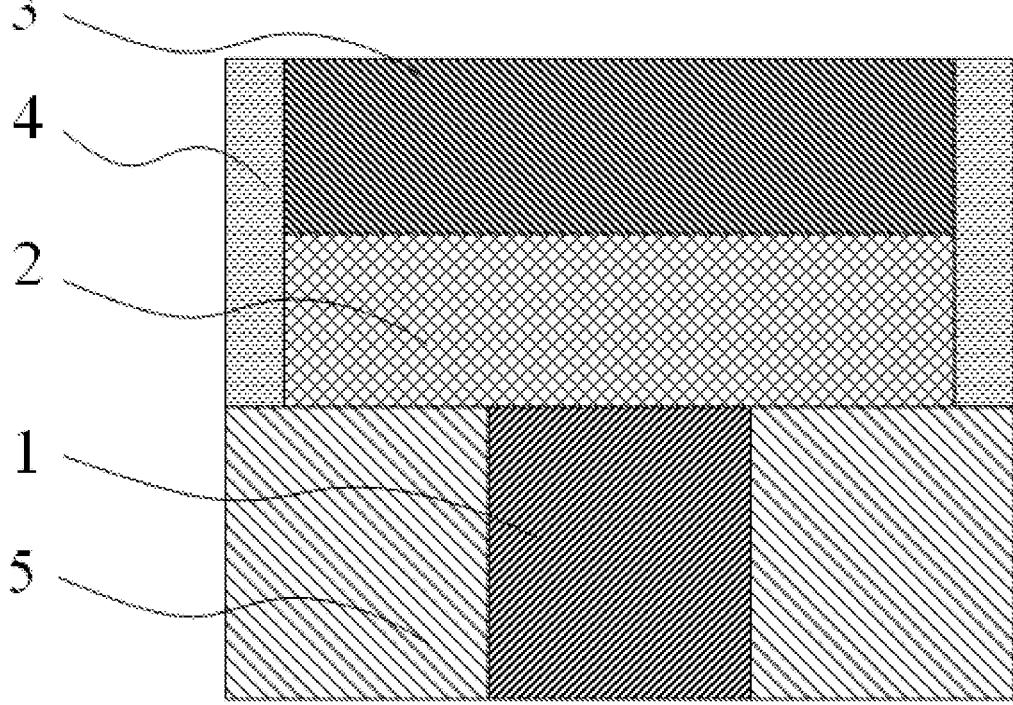
FIG. 2 is a schematic structural view of a threshold switching device having a T-type structure according to an embodiment of the present invention.

An embodiment of the present invention provides a threshold switching device, which, as shown in FIG. 1 to 2, includes a first electrode 1, a threshold switching material layer 2 and a second electrode 3 layer by layer from bottom to top. The threshold switching material layer 2 includes the threshold switching material as described in the embodiment of the present invention above.

The threshold switching material layer of the threshold switching device in the present embodiment uses $M_xD_{1-x}$ with a volatile threshold transition function. Compared with the existing binary system-threshold switching materials, M is selected from metal elements (M is one of La, Ce, Gd, Lu, Sc, Y, Zr, Mo, Hf, W, Ta), with a good conductivity, which is beneficial to increase the driving current of the device and form a specific node of a conductive path, reducing the randomness of the conductive path formation and improving the switching speed of the threshold switching device. The selected element of M has an atomic number greater than 20, a large atomic radius, and a small atomic diffusion coefficient, which is not prone to component segregation during the repeated operations of the device, and the stability is high, so that the threshold switching device has a longer fatigue life and higher device reliability. Based on the unique d-orbital electronic structure of the selected element of M, when combined with one of S, Se, and Te, the crystallization activation energy of the resulted material is high, so that the threshold switching device has a lower leakage current. Therefore, the threshold switching device according to the embodiment of the present invention has nonlinear switching characteristics, and has advantages of high driving current, low leakage current, large switching ratio, fast switching speed (up to 10 ns or less), long cycle life, and high reliability, which can be combined with resistance change and phase change memory cells to obtain high-density, high-performance information storage chips.

In this embodiment, the off-state resistance of the threshold switching material layer of the threshold switching device is a high-resistance state, and the on-state resistance when it is turned on is a low-resistance state. The high-resistance state $R_H$ satisfies: 40 $\Omega$·cm$\leq R_H \leq 2 \times 10^5$ $\Omega$·cm, the low-resistance state $R_L$ satisfies: $4 \times 10^{-5}$ $\Omega$·cm$\leq R_L \leq 2 \times 10^{-3}$ $\Omega$·cm, and the volatile threshold transition voltage $V_t$h satisfies: 0.5 V$\leq V_{th} \leq 5$ V. The initial state of the threshold switching material of the threshold switching device is an amorphous state, and the amorphous state is maintained during the process of performing volatile electrical threshold transition operation.

In the embodiment of the present invention, the threshold switching device includes two structures, one of which is a restrictive structure. As shown in FIG. 1, the threshold switching device with the restrictive structure includes:

a first electrode 1;

a threshold switching material layer 2 which is disposed on the first electrode 1, and includes the threshold switching material as described in the above embodiment of the present invention;

a second electrode 3 which is arranged on the threshold switching material layer 2; and a dielectric coating layer 4 which is coated on the side of the whole of the first electrode 1, the threshold switching material layer 2 and the second electrode 3. The function of the dielectric coating layer is to prevent the oxidation of the threshold switching material.

In one embodiment, the first electrode is cylindrical, and the diameter of the first electrode is in the range of 50 to 150 nm, for example, may be 50 nm, 60 nm, 70 nm, 80 nm, 90 nm, 100 nm, 110 nm, 120 nm, 130 nm, 140 nm or 150 nm, etc. The diameter of the first electrode affects the driving current, cycle life, storage density, etc. of the threshold switching device, and the larger the diameter of the first electrode, the worse the overall performance of the threshold switching device. When the diameter of the first electrode is in the range of 50 to 150 nm, the overall performance of the threshold switching device is better.

In the restrictive structure, the second electrode has the same shape and diameter as the first electrode, and there is no specific requirement on the thickness of the first electrode and the second electrode, which can be set according to actual needs. As an example, the thickness of the first electrode and the thickness of the second electrode can be in the range of 20 to 500 nm, for example, may be 20 nm, 50 nm, 80 nm, 100 nm, 150 nm, 200 nm, 300 nm, 400 nm, or 500 nm.

In one embodiment, the thickness of the threshold switching material layer is in the range of 2 to 40 nm, for example, may be 2 nm, 5 nm, 8 nm, 10 nm, 15 nm, 20 nm, 25 nm, 30 nm, 35 nm or 40 nm. By controlling the compositions of the threshold switching material layer and optimizing the thickness, the threshold switching material layer can resist the high temperature in the back-end process of the CMOS, and the threshold switching material can be maintained in an amorphous phase.

In one embodiment, the material of the first electrode is selected from at least one of W, TiW, TiN, TiSiN, but is not limited thereto.

In one embodiment, the material of the second electrode is selected from at least one of W, TiW, and TiN, but is not limited thereto.

In one embodiment, the dielectric coating layer is selected from at least one of $SiO_2$ and $Si_3N_4$, but is not limited thereto.

The other structure is a T-type structure, as shown in FIG. 2, the threshold switching device having the T-type structure includes:

a substrate 5 with a through hole;

a first electrode 1 which is arranged in the through hole;

a threshold switching material layer 2 which is disposed on the substrate 5 and the first electrode 1, and includes the threshold switching material as described in the above embodiment of the present invention;

a second electrode 3 which is arranged on the threshold switching material layer 2; and a dielectric coating layer 4 which is coated on the side of the whole of the threshold switching material layer 2 and the second electrode 3. The function of the dielectric coating layer is to prevent the oxidation of the threshold switching material.

In one embodiment, the first electrode is cylindrical, and the diameter of the first electrode is in the range of 50 to 150 nm, for example, may be 50 nm, 60 nm, 70 nm, 80 nm, 90 nm, 100 nm, 110 nm, 120 nm, 130 nm, 140 nm or 150 nm, etc. The diameter of the first electrode affects the driving current, cycle life, storage density, etc. of the threshold switching device, and the larger the diameter of the first electrode, the worse the overall performance of the threshold switching device. When the diameter of the first electrode is in the range of 50 to 150 nm, the overall performance of the threshold switching device is better.

In one embodiment, the thickness of the first electrode is in the range of 100 to 500 nm, that is, the thickness of the substrate with the through hole is in the range of 100 to 500 nm, for example, may be 100 nm, 150 nm, 200 nm, 300 nm, 400 nm, or 500 nm. The thickness of the first electrode is determined mainly considering the substrate covering the first electrode (the substrate is made of an insulating material and can prevent the oxidation of the first electrode). If the substrate is too thin, leakage current may occur and affect the actual efficiency of electric energy of the device. When the thickness of the first electrode is in the range of 100 to 500 nm (and thus the thickness of the substrate is also in the range of 100 to 500 nm), the substrate is not too thin to avoid the occurrence of leakage current.

In the T-type structure, the threshold switching material layer is arranged on the substrate and the first electrode, that is, the area of the threshold switching material layer is larger than that of the first electrode, and the threshold switching material layer on the substrate completely covers the first electrode. Further, the first electrode corresponds to the center of the threshold switching material layer.

Further, the horizontal cross section of the threshold switching material layer may be square or rectangular. In the horizontal direction, the side length of the threshold switching material layer is at least twice the diameter of the first electrode. The active area of the threshold switching material layer above the first electrode is generally hemispherical, and this multiple can ensure that the active area of the threshold switching material layer completely covers the first electrode.

In one embodiment, the thickness of the threshold switching material layer is in the range of 2 to 40 nm. By controlling the compositions of the threshold switching material layer and optimizing the thickness, the threshold switching material layer can resist the high temperature in the back-end process of the CMOS, and the threshold switching material can be maintained in an amorphous phase.

In the T-type structure, the second electrode has the same shape and size as the threshold switching material layer, and they have the same thickness.

In one embodiment, the material of the substrate is selected from at least one of $SiO_2$ and $Si_3N_4$, but is not limited thereto.

In one embodiment, the material of the first electrode is selected from at least one of W, TiW, TiN, and TiSiN.

In one embodiment, the material of the second electrode is selected from at least one of W, TiW, and TiN.

In one embodiment, the material of the dielectric coating layer is selected from at least one of $SiO_2$ and $Si_3N_4$, but is not limited thereto.

The embodiment of the present invention further provides a preparation method of a threshold switching device, which includes the steps of:

S1. providing a first electrode;

S2. forming a threshold switching material layer on the first electrode, the material of the threshold switching material layer includes the threshold switching material as described in the above embodiment of the present invention; and S3. forming a second electrode on the threshold switching material layer.

In this embodiment, the specific composition, shape, thickness, etc. of the first electrode, the second electrode, and the threshold switching material can be referred to above, and will not be repeated here.

In step S1, the preparation method of the first electrode includes but not limited to sputtering, evaporation, physical vapor deposition, chemical vapor deposition, plasma enhanced chemical vapor deposition, molecular beam epitaxy, atomic layer deposition, atomic vapor deposition, metal compound vapor deposition and the like.

In step S2, the threshold switching material can be formed on the first electrode by one of methods including, but not limited to, sputtering, evaporation, physical vapor deposition, chemical vapor deposition, plasma enhanced chemical vapor deposition, molecular beam epitaxy, atomic layer deposition, atomic vapor deposition, metal compound vapor deposition and the like.

In step S3, the second electrode can be formed on the threshold switching material layer by one of methods including, but not limited to, sputtering, evaporation, physical vapor deposition, chemical vapor deposition, plasma enhanced chemical vapor deposition, molecular beam epitaxy, atomic layer deposition, atomic vapor deposition, metal compound vapor deposition and the like.

After step S3, the preparation method of the threshold switching device further includes the steps of:

subjecting the whole of the first electrode, the threshold switching material layer, and the second electrode that are overlapped layer by layer to photolithography to etch a preset shape, so that the first electrode corresponds to the center of the threshold switching material layer. Alternatively, the first electrode, the threshold switching material layer, and the second electrode can be preset in shape in the above steps, and then overlapped layer by layer to obtain the preset shape, without etching at the end.

Specific examples will be described in detail in the following.

Example 1

As shown in FIG. 2, this example provides a threshold switching device having a T-type structure, including a substrate 5 with a through hole which is formed in the substrate 5, a first electrode 1 disposed in the through hole, a threshold switching material layer 2 arranged on the substrate 5 and the first electrode 1, a second electrode 3 arranged on the threshold switching material layer 2, and a dielectric coating layer 4 coated on the side of the whole of the threshold switching material layer 2 and the second electrode 3. The first electrode corresponds to the center of the threshold switching material layer.

The material of the first electrode is TiN, the first electrode is cylindrical, its diameter is 100 nm, and its thickness is 200 nm. The material of the second electrode is W, and the second electrode is cuboid (that is, a cuboid with a square bottom), the horizontal cross section has a shape of square with a side length of 10 μm, and the vertical thickness is 8 nm.

The threshold switching material is $Sc_{0.4}Te_{0.6}$, and the shape and size of the threshold switching material layer are the same as those of the second electrode (a cuboid with a square bottom with a side length of 10 μm and a thickness of 8 nm);

The material of the dielectric coating layer is $SiO_2$, and the height in the vertical direction is 16 nm.

The preparation method of the threshold switching device having a T-type structure includes the steps of:

providing a $SiO_2$ substrate in a thickness of 200 nm with a through hole, the diameter of the through hole being 100 nm, and the height of the through hole being 200 nm;

forming a first electrode in a cylindrical TiN layer with a diameter of 100 nm and thickness of 200 nm through chemical vapor deposition in the through hole;

forming a threshold switching material layer of $Sc_{0.4}Te_{0.6}$ with a thickness of 8 nm and a bottom side length of 10 μm (the horizontal cross section is square) through magnetron sputtering, wherein the background vacuum of the magnetron sputtering is $1 \times 10^{-5}$ Pa, the Ar gas pressure in the chamber is 0.2 Pa during sputtering, by co-sputtering a Sc element target (the sputtering power is 50 W) and a Te element target (sputtering power is 15 W) on the first electrode for 3 minutes;

forming a second electrode by depositing a TiN layer with a thickness of 8 nm on the threshold switching material layer by chemical vapor deposition and performing photolithography to obtain a pattern with a bottom side length of 10 μm (the horizontal cross section is square); and depositing 30 nm of $SiO_2$ through chemical vapor deposition, and removing the $SiO_2$ on the second electrode by chemical mechanical polishing, with the remaining $SiO_2$ around the second electrode and the threshold switching material layer forming a dielectric coating layer.

After testing, the high-resistance state $R_H$ of the threshold switching material layer of the threshold switching device having a T-type structure in Example 1 is $1.6 \times 10^3$ Ω·cm, the low-resistance state $R_L$ is $1.2 \times 10^{-3}$ Ω·cm, and the volatile threshold transition voltage $V_{th}$ is 1.1 V.

Figure 3:
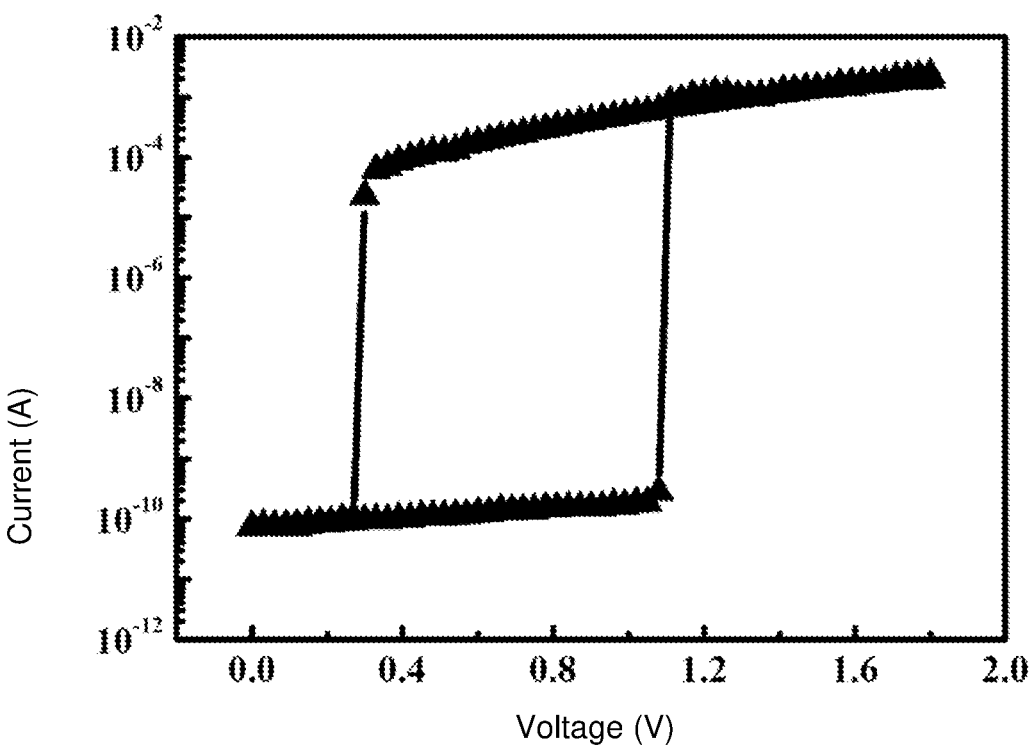
FIG. 3 shows a current-voltage performance curve of the threshold switching device having a T-type structure according to the first example of the present invention.

The current-voltage operation performance curve of the threshold switching device having a T-type structure in Example 1 is shown in FIG. 3. It can be seen that the threshold switching device can realize the turn-on operation from the high-resistance state to the low-resistance state when the threshold voltage is 1.1 V, and when the voltage drops to 0.2 V, the threshold switching device realizes the turn-off operation from the high-resistance state to the low-resistance state. Unlike $TiTe_2$ and other metal tellurides that always maintain a low resistance state and cannot achieve switching operations, in this example, the threshold switching device with a $Sc_{0.4}Te_{0.6}$ layer with a thickness of 8 nm can achieve threshold transition operation. In addition, it can be seen from FIG. 3 that the driving current of the threshold switching device having a T-type structure in Example 1 is $1 \times 10^{-3}$ A, and the leakage current is $1 \times 10^{-10}$ a.

Figure 4:
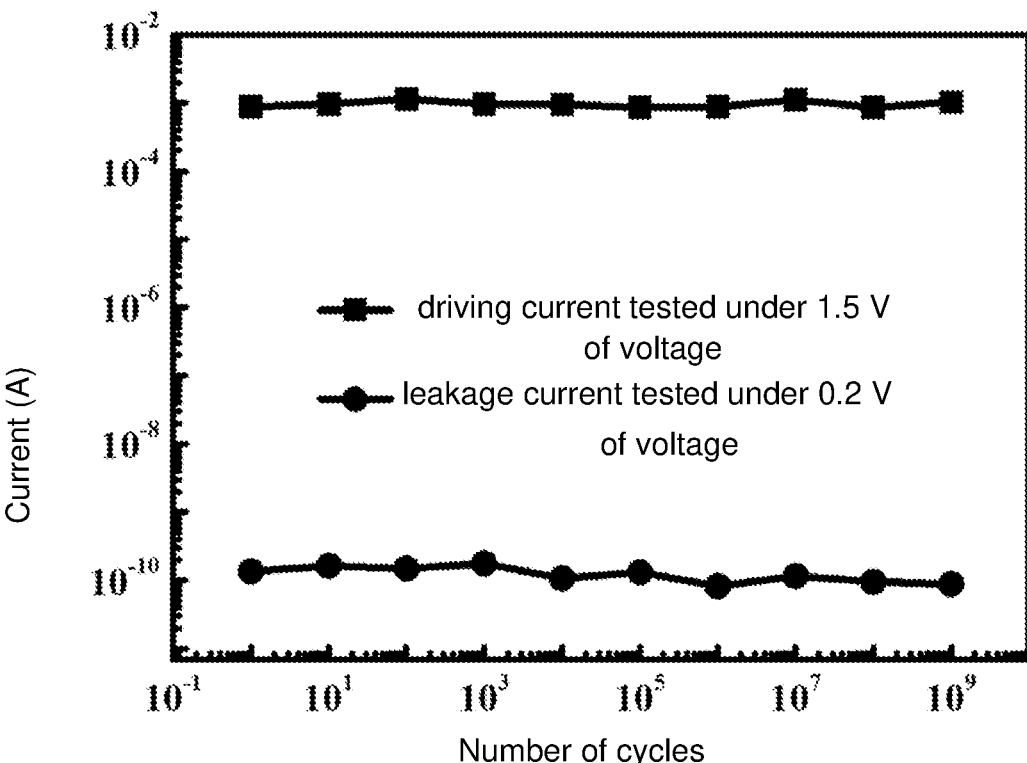
FIG. 4 is a fatigue cycle performance curve of the threshold switching device having a T-type structure according to the first example of the present invention.

The fatigue cycle operation performance curve of the threshold switching device having a T-type structure in Example 1 is shown in FIG. 4. After repeated switching operations of $1 \times 10^9$ times, the threshold switching device still has no failure, and the switching ratio has at least 7 orders of magnitude.

After testing, the driving current of the threshold switching device having a T-type structure based on the existing $B_{0.3}Te_{0.7}$ (which differs from Example 1 only in that the threshold switching material is $B_{0.3}Te_{0.7}$) is $1 \times 10^{-4}$ A, the leakage current is $1 \times 10^{-9}$ A, and the cycle life is $1 \times 10^8$ times. The driving current of the threshold switching device having a T-type structure based on the existing $C_{0.35}Te_{0.65}$ (which differs from Example 1 only in that the threshold switching material is $C_{0.35}Te_{0.65}$) is $5 \times 10^{-4}$ A, the leakage current is $5 \times 10^{-9}$ A, and the cycle life is $1 \times 10^8$ times. The driving current of the threshold switching device having a T-type structure based on the existing $Si_{0.24}Te_{0.76}$ (which differs from Example 1 only in that the threshold switching material is $Si_{0.24}Te_{0.76}$) is $8 \times 10^{-4}$ A, the leakage current is $8 \times 10^{-10}$ A, and the cycle life is $1 \times 10^5$ times. The above data are summarized in Table 1 below.

TABLE 1

Test Data for Different Threshold Switching Devices

| device | performance | | |
| --- | --- | --- | --- |
| | driving current (A) | leakage current (A) | cycle life (times) |
| threshold switching device having a T-type structure based on $Sc_{0.4}Te_{0.6}$ in example 1 | $1 \times 10^{-3}$ | $1 \times 10^{-10}$ | greater than $1 \times 10^9$ |
| threshold switching device having a T-type structure based on existing $B_{0.3}Te_{0.7}$ | $1 \times 10^{-4}$ | $1 \times 10^{-9}$ | $1 \times 10^8$ |
| threshold switching device having a T-type structure based on existing $C_{0.35}Te_{0.65}$ | $5 \times 10^{-4}$ | $5 \times 10^{-9}$ | $1 \times 10^8$ |
| threshold switching device having a T-type structure based on existing $Si_{0.24}Te_{0.76}$ | $8 \times 10^{-4}$ | $8 \times 10^{-10}$ | $1 \times 10^5$ |

It can be seen that the threshold switching device having a T-type structure provided by the present invention has higher driving current, lower leakage current, longer cycle life, and better stability than the existing threshold switching devices based on binary systems such as B—Te, C—Te, and Si—Te.

Example 2

This example provides a threshold switching device having a T-type structure, which differs from the example 1 only in that the threshold switching material is $Gd_{0.5}Se_{0.5}$.

The difference between the preparation method of the threshold switching device having a T-type structure and that in the example 1 is only:

forming a threshold switching material layer of $Gd_{0.5}Se_{0.5}$ with a thickness of 8 nm and a bottom side length of 10 μm (the horizontal cross section is square) through magnetron sputtering, wherein the background vacuum of the magnetron sputtering is $1 \times 10^{-5}$ Pa, the Ar gas pressure in the chamber is 0.2 Pa during sputtering, by co-sputtering a Gd element target (the sputtering power is 40 W) and a Se element target (sputtering power is 15 W) on the first electrode for 3 minutes.

After testing, the threshold switching device having a T-type structure according to this example has similar threshold transition characteristics to that of Example 1.

Example 3

As shown in FIG. 1, this example provides a threshold switching device having a restrictive structure, including a first electrode 1, a threshold switching material layer 2, and a second electrode 3 overlapped layer by layer from bottom to top, and further includes a dielectric coating layer 4, coated on the side of the whole of the first electrode 1, the threshold switching material layer 2 and the second electrode 3 that are overlapped layer by layer.

The material of the first electrode is TiN, the first electrode is cylindrical, its diameter is 100 nm, and its thickness is 20 nm. The material of the second electrode is TiN, the second electrode is cylindrical, the diameter of the second electrode is 100 nm, and the thickness of the second electrode is 20 nm.

The threshold switching material is $Lu_{0.4}Te_{0.6}$, the thickness of the threshold switching material layer is 10 nm, and its shape and diameter are the same as those of the first electrode. The material of the dielectric coating layer is $SiO_2$, and the vertical height is 50 nm.

The preparation method of the threshold switching device having a restrictive structure includes the steps of:

preparing a TiN layer with a thickness of 20 nm by magnetron sputtering;

forming a $Lu_{0.4}Te_{0.6}$ layer with a thickness of 10 nm by magnetron sputtering, wherein the background vacuum of the magnetron sputtering is $1 \times 10^{-5}$ Pa, the Ar gas pressure in the chamber is 0.2 Pa during sputtering, by co-sputtering a Lu element target (the sputtering power is 60 W) and a Te element target (sputtering power is 15 W) on the TiN layer for 4 minutes;

preparing a TiN layer with a thickness of 20 nm on the $Lu_{0.4}Te_{0.6}$ layer by magnetron sputtering;

subjecting the device obtained above to photolithographic etching to obtain a cylindrical pattern with a diameter of 100 nm, which is the first electrode, the threshold switching material layer, and the second electrode from bottom to top; and preparing 80 nm of $SiO_2$ by magnetron sputtering, and removing the $SiO_2$ on the second electrode by chemical mechanical polishing, with the remaining $SiO_2$ around the first electrode, the second electrode and the threshold switching material layer forming a dielectric coating layer.

After testing, the threshold switching device has similar threshold transition characteristics to that in Example 1.

In summary, the present invention provides a threshold switching material, a threshold switching device and a preparation method thereof. The threshold switching material $M_xD_{1-x}$ provided by the invention has a volatile threshold transition function, wherein M is selected from La, Ce, Gd, Lu, Sc, Y, Zr, Mo, Hf, W, Ta. That is, compared with the existing binary system-threshold switching materials, M in the present invention is selected as a metal element, with a good conductivity, which is beneficial to increase the driving current and form a specific node of a conductive path, reducing the randomness of the conductive path formation and improving the switching speed of the threshold switching device based on such threshold switching material. Based on the unique d-orbital electronic structure of the selected element of M, when combined with one of S, Se, and Te, the crystallization activation energy of the resulted material is high, thereby obtaining a lower leakage current. The selected element of M has an atomic number greater than 20, a large atomic radius, and a small atomic diffusion coefficient, which is not prone to component segregation, and the stability is high, which in turn facilitates to obtain a longer fatigue life and higher device reliability.

It should be understood that the application of the present invention is not limited to the above examples, and those skilled in the art can make improvements or changes according to the above descriptions, and all these improvements and changes should fall into the scope of protection of the appended claims of the present invention.

The invention claimed is:

1. A threshold switching material, which has chemical formula of $M_xD_{1-x}$, wherein M is one of La, Ce, Gd, Lu, Sc, Y, Zr, Mo, Hf, W and Ta, D is one of S, Se and Te, and $0.1 \leq x \leq 0.8$.

2. A threshold switching device, comprising a first electrode, a threshold switching material layer and a second electrode overlapped layer by layer from bottom to top, the threshold switching material layer comprising the threshold switching material according to claim 1.

3. The threshold switching device according to claim 2, wherein the threshold switching device further comprises:

a dielectric coating layer coated on a side of a whole of the first electrode, the threshold switching material layer and the second electrode that are overlapped layer by layer.

4. The threshold switching device according to claim 2, wherein the threshold switching device further comprises:

a substrate having a through hole, the first electrode is disposed in the through hole, and the threshold switching material layer is disposed on the substrate and the first electrode; and a dielectric coating layer coated on a side of a whole of the threshold switching material layer and the second electrode that are overlapped layer by layer.

5. The threshold switching device according to claim 3, wherein a material of the first electrode is at least one of W, TiW, TiN and TiSiN.

6. The threshold switching device according to claim 4, wherein a material of the first electrode is at least one of W, TiW, TiN and TiSiN.

7. The threshold switching device according to claim 3, wherein a material of the second electrode is at least one of W, TiW and TiN.

8. The threshold switching device according to claim 4, wherein a material of the second electrode is at least one of W, TiW and TiN.

9. The threshold switching device according to claim 3, wherein a material of the dielectric coating layer is at least one of $SiO_2$ and $Si_3N_4$.

10. The threshold switching device according to claim 4, wherein a material of the dielectric coating layer is at least one of $SiO_2$ and $Si_3N_4$.

11. The threshold switching device according to claim 3, wherein a thickness of the threshold switching material layer is in a range of 2 to 40 nm.

12. The threshold switching device according to claim 4, wherein a thickness of the threshold switching material layer is in a range of 2 to 40 nm.

13. The threshold switching device according to claim 4, wherein a material of the substrate is at least one of $SiO_2$ and $Si_3N_4$.

14. A preparation method of a threshold switching device, comprising steps of:

providing a first electrode;

forming a threshold switching material layer on the first electrode, a material of the threshold switching material layer comprising the threshold switching material according to claim 1; and forming a second electrode on the threshold switching material layer.

* * * * *